United States Patent
Shindo et al.

(10) Patent No.: US 7,357,295 B2
(45) Date of Patent: Apr. 15, 2008

(54) SOLDER BALL SUPPLYING METHOD AND SUPPLYING DEVICE

(75) Inventors: Osamu Shindo, Tokyo (JP); Toru Mizuno, Tokyo (JP); Youichi Andoh, Tokyo (JP); Satoshi Yamaguchi, Tokyo (JP)

(73) Assignees: TDK Corporation, Tokyo (JP); SAE Magnetics (H.K.) Ltd., Shatin (HK)

( * ) Notice: Subject to any disclaimer, the term of this patent is extended or adjusted under 35 U.S.C. 154(b) by 213 days.

(21) Appl. No.: 10/933,389

(22) Filed: Sep. 3, 2004

(65) Prior Publication Data

US 2005/0045701 A1    Mar. 3, 2005

(30) Foreign Application Priority Data

Sep. 3, 2003    (JP)    ............... 2003-311010

(51) Int. Cl.
*B23K 31/02* (2006.01)
*B23K 37/00* (2006.01)

(52) U.S. Cl. ............... 228/246; 228/41
(58) Field of Classification Search ............... None
See application file for complete search history.

(56) References Cited

U.S. PATENT DOCUMENTS

| | | | | |
|---|---|---|---|---|
| 4,871,110 A | * | 10/1989 | Fukasawa et al. | 228/245 |
| 5,499,487 A | * | 3/1996 | McGill | 53/473 |
| 6,336,581 B1 | * | 1/2002 | Tuchiya et al. | 228/33 |
| 6,641,030 B1 | * | 11/2003 | Freeman et al. | 228/246 |
| 2002/0053591 A1 | * | 5/2002 | Razon et al. | 228/258 |
| 2002/0058406 A1 | * | 5/2002 | Mukuno et al. | 438/626 |
| 2003/0127501 A1 | * | 7/2003 | Cheng et al. | 228/246 |
| 2004/0149805 A1 | * | 8/2004 | Ito | 228/41 |

FOREIGN PATENT DOCUMENTS

| | | |
|---|---|---|
| JP | 7-245473 | 9/1995 |
| JP | 8-236916 | 9/1996 |
| JP | 2002025025 A | 1/2002 |
| WO | WO 97/20654 | 6/1997 |

* cited by examiner

*Primary Examiner*—Kiley Stoner
(74) *Attorney, Agent, or Firm*—Oblon, Spivak, McClelland, Maier & Neustadt, P.C.

(57) ABSTRACT

After introducing a solder ball from a hopper into a receiving hole of a ball separator, the ball separator is slid between blocks, and the solder ball is sent out to a portion outside of the blocks. By suctioning the solder ball from within a projected region on a lower block which is situated inside of the receiving hole at a time when the solder ball is taken into the receiving hole and surrounds a rolling trajectory of the solder ball that has been taken into the receiving hole, the solder ball is forcibly introduced into the receiving hole.

10 Claims, 7 Drawing Sheets

SOLDER BALL SUPPLYING METHOD AND SUPPLYING DEVICE

BACKGROUND OF THE INVENTION

1. Field of the Invention

The present invention relates to a solder ball supplying method and a solder ball supplying device. In particular, the present invention relates to a solder ball supplying method and a solder ball supplying device that are suited for making fine connections, such as connections between a bonding pad that is formed on a magnetic head slider and a pad that is formed on a lead frame side.

2. Description of the Related Art

A connection method is conventionally known, with which electrodes that are objects to be joined are placed close to each other, the electrodes are made to contact ball-shaped solder (hereinafter called solder ball) by using a suctioning jig or the like, and the solder ball is melted, thus making an electrical connection between the electrodes.

A solder ball supplying device that reliably supplies solder balls to the suctioning jig is used in this type of connection method.

FIG. 7 is a structural explanatory diagram that shows a conventional solder ball supplying device.

As shown in FIG. 7, a conventional solder ball supplying device 1 has an upper block 2 and a lower block 3. A ball separator 4 that can slide along a gap between the upper block 2 and the lower block 3 is provided in a location where it is sandwiched by the upper block 2 and the lower block 3.

A hopper 5 that has an opening in an upper surface is provided to the upper block 2. The hopper 5 can store a large number of solder bails 6 with the ball separator 4 used as a bottom surface. Further, an air path 7 that passes through the upper block 2 in a vertical direction is formed in the upper block 2 in the vicinity of the hopper 5.

It is thus possible to supply nitrogen gas that is used to prevent oxidation of the solder balls 6 from a nitrogen supplying means (not shown) provided above the upper block 2 to the air path 7.

A receiving hole 8 that can only take in one of the solder balls 6 is provided in the ball separator 4. The solder balls 6 that freely fall from the hopper 5 go into the receiving hole 8, and the ball separator 4 is made to slide. It is thus possible to convey the solder ball 6 that has gone into the receiving hole 8 to a position directly below the air path 7.

A delivery path 9 that is provided with a diameter that is at least equal to or greater than the outer diameter of the solder balls 6 is provided to the lower block 3, coaxially with the air path 7 formed in the upper block 2. Accordingly, when the ball separator 4 is slid, and the solder ball 6 that has gone into the receiving hole 8 is moved to a position directly below the air path 7, the solder ball 6 is sent through the delivery path 9 to a portion outside of the supplying device by the nitrogen gas that is supplied within the air path 7. The solder ball 6 then moves to a ball receiving pad (not shown) that is formed in an end portion of the delivery path 9. Suctioning is provided to the solder ball 6 by using a suctioning jig or the like, and the solder ball 6 is conveyed to a target joining portion.

It should be noted that ball separators that simply move reciprocatively between the hopper 5 and the air path 7, and those configured by a porous disk are known and may be used as the ball separator 4 described above (refer to JP 2002-25025 A (FIG. 9), and JP 11-509375 A (page 12, lines 18 to 22)).

Further, other configurations of a solder ball supplying device are known. One solder ball supplying device uses a three layer structure consisting of an arrangement mask, a shutter mask, and a supply mask. By sliding the shutter mask that is sandwiched between the arrangement mask and the supply mask, a solder ball freely falls from the arrangement mask side to the supply mask side to be supplied onto a pad (refer to JP 8-236916 A (FIG. 8)). Another device uses an ejector pin that has a suctioning function to push up a hopper, in which a plurality of solder balls are stored, from below to separate out one solder ball from the hopper (refer to JP 7-245473 A, FIG. 4 and FIG. 6, for example).

However, problems such as those described below exist with the solder ball supplying devices mentioned above.

That is, with the connection method that uses a solder ball, the outer diameter of the solder ball becomes smaller with miniaturization of an object to be joined. Accordingly, if the solder balls themselves are charged with static electricity, there is a problem in that the solder ball cannot be reliably supplied with a method (the so-called free fall method) in which each solder ball is separated out by its own weight, because separation characteristics between the balls worsen due to the reduced weight of the solder balls.

Further, the separation characteristics of the solder balls worsen also when using the method of pushing up and separating a solder ball from a hopper, in which a large number of solder balls are stored, by using an ejector pin. Accordingly, other solder balls are connected to the solder ball that is pushed up, taking on the shape of a bunch of grapes. A problem exists in that it is difficult to extract a single solder ball.

With the solder ball supplying device 1 described above, the solder ball 6 may rub against a block side, causing a jam in a device main body, if the solder ball 6 is not completely received within the receiving hole 8. Disassembly work to remove the upper block 2 becomes necessary in order to remove the solder ball 6 from the receiving hole 8, and this is difficult from the viewpoint of maintenance.

SUMMARY OF THE INVENTION

In consideration of the conventional problems described above, a first object of the present invention is to provide a solder ball supplying method and a solder ball supplying device with which individual solder balls are reliably separated and supplied, even if the solder balls are small in size and the separation characteristics between the solder balls worsen due to static electricity. In addition, a second object of the present invention is to provide a solder ball supplying method and a solder ball supplying device with which it is possible to easily remove solder balls without needing to disassemble the solder ball supplying device itself if jamming of solder balls develops.

The present invention is made based upon the finding that solder balls whose separation characteristics have worsened due to static electricity can easily be separated provided that the separation of the solder balls is forcibly performed by an external force, not only by the weight of the solder balls themselves. In addition, the present invention is made based upon the finding that the solder balls can be removed when a solder ball jam occurs within a supply path provided that air is fed within the supply path.

That is, according to the present invention, there is provided a solder ball supplying method including: introducing a solder ball from a hopper formed in an upper block to a receiving hole of a ball separator that is sandwiched between the upper block and a lower block; sliding the ball separator between the upper block and the lower block; and sending the solder ball that has been taken into the receiving hole to an outside of the upper block and the lower block, wherein when introducing the solder ball from the hopper into the receiving hole, the solder ball is forcibly introduced into the receiving hole by sucking the solder ball from within a projected region on the lower block, the projected region being situated inside of the receiving hole at a time when the solder ball is taken into the receiving hole and surrounding a rolling trajectory of the solder ball that has been taken into the receiving hole.

Further, it is desirable to increase a pressure within the hopper when introducing the solder ball from the hopper into the receiving hole, or swing the upper block in a direction in which the ball separator slides when introducing the solder ball from the hopper into the receiving hole.

Further, the solder ball supplying method may also include: inserting an intermediate block between the upper block and the ball separator, the intermediate block having a plate thickness of a multiple of a diameter of the solder ball and including a solder ball introduction path of a size corresponding to an inner diameter of the receiving hole; and performing alignment on the solder ball in the solder ball introduction path before the solder ball is introduced into the receiving hole.

Further, the solder ball supplying method preferably includes, when the solder ball is jammed while being conveyed from the hopper to the receiving hole, removing the jammed solder ball by moving the upper block in a direction in which the ball separator slides, and feeding air into a path extending from the upper block to the lower block through a cleaning path that is formed in the upper block.

Further, according to the present invention, there is provided a solder ball supplying device including: an upper block in which a hopper for introducing a solder ball is provided; a lower block; a ball separator that is sandwiched between the upper block and the lower block and that has a receiving hole to which the solder ball is taken in from a bottom portion of the hopper, the ball separator sending the solder ball, which has been taken into the receiving hole by sliding of the ball separator, to an outside of the upper block and the lower block as the ball separator slides; and a solder ball suction path provided within a projected region on the lower block, the projected region being situated inside of the receiving hole at a position where the solder ball is taken in and surrounding a rolling trajectory of the solder ball that has been taken into the receiving hole, the solder ball being forcibly introduced form the hopper into the receiving hole by using the solder ball suction path.

Here, it is desirable that a gas supplying means for increasing a pressure within the hopper be connected to the upper block, or that swinging means be provided to the upper block, for enabling the upper block to move reciprocatively in a direction in which the ball separator slides.

Further, the solder ball supplying device may include an intermediate block provided between the upper block and the ball separator, the intermediate block having a plate thickness that is a multiple of a diameter of the solder ball and having a solder ball introduction path of a size that corresponds to an inner diameter of the receiving hole.

Further, it is preferable that a cleaning path be provided in the upper block and by a side of the hopper, and that the solder ball that is jammed within a path extending from the upper block to the lower block through the cleaning path be removed by feeding air into the path.

According to the configuration described above, by performing suction from the solder ball suction path, a large number of solder balls introduced into the hopper are reliably taken into the receiving hole by being directly sucked from the receiving hole that is continuous with the solder ball suction path.

The solder ball suction path discussed here is formed within a projected region on a lower block which is situated inside of the receiving hole at a position where a solder ball is taken in, and which surrounds a rolling trajectory of the solder ball that has been taken into the receiving hole. Accordingly, the lowest point of the solder ball does not interfere with the solder ball suction path, even if the ball separator is made to slide. That is, the lowest point of the solder ball is always in rolling contact with a surface of the lower block on which the ball separator slides, and the height of the ball is maintained as constant. Therefore, it is possible to prevent a situation where the solder ball and the vicinity of an end of the solder ball suction path interfere with each other due to a step formed therebetween, causing defects such as the solder ball being caught in the step.

In addition, it is possible to increase the pressure within the hopper (internal pressure) because the gas supplying means is connected to the upper block. Accordingly, it becomes possible to push out the solder ball from the hopper side to the receiving hole, and introduction of the solder ball into the receiving hole can be made more reliable together with the suction from the solder ball suction path. It should be noted that it becomes possible to prevent oxidation of the solder balls within the hopper by using an inert gas, typically nitrogen gas or the like, for the gas that is supplied from the gas supplying means. Further, it becomes possible to agitate the solder balls within the hopper when swinging means is provided to the upper block, and introduction of the solder ball into the receiving hole can be made more reliable together with the suction from the solder ball suction path.

It should be noted that the solder balls can be aligned prior to being introduced into the receiving hole by inserting an intermediate block between the upper block and the ball separator. It thus becomes possible to reliably introduce the solder ball into the receiving hole. The solder balls that are located within the solder ball introduction path do not protrude out form the intermediate block because the plate thickness of the intermediate block is set to an integer multiple of the diameter of the solder balls. Accordingly, the solder balls located within the solder ball introduction path can be prevented from interfering with the ball separator side, that is, with an edge portion of the receiving hole. Jamming due to the solder ball becoming caught in the edge portion can thus be prevented.

In addition, when a cleaning path is provided by the side of the upper block, an air feed pathway made up of a cleaning path, the solder ball introduction path, the receiving hole, and the solder ball suction path can be formed by sliding the upper block. Accordingly, even if solder ball jam occurs while the solder ball is being sent out, the solder ball that is causing the jam can be removed to an outer portion of the solder ball supplying device, without disassembling the solder ball supplying device itself, by forming the air feed pathway and feeding air to the air feed pathway.

According to the present invention as discussed above, the solder ball supplying device has the upper block in which the hopper for introducing the solder ball is formed, the lower block, and the ball separator sandwiched between the two blocks and having the receiving hole into which the solder ball is taken in from a bottom portion of the hopper. The ball separator sends the solder ball held in the receiving hole out to an external portion of the blocks by sliding. The solder ball suction path is formed within a projected region on a lower block which is situated inside of the receiving hole at the position where the solder ball is taken in and which surrounds the rolling trajectory of the solder ball that has been taken into the receiving hole. The solder ball is forcibly introduced into the receiving hole from the hopper. Accordingly, even if the solder balls are small in size, and the separation characteristics of the solder balls worsen due to static electricity, it becomes possible to reliably separate and supply each of the solder balls. The cleaning path is provided by the side of the hopper in the upper block, and air is fed to a path extending from the upper block to the lower block via the cleaning path. Therefore, even when a solder ball jam occurs, for example, the solder ball can be easily removed without needing to disassemble the solder ball supplying device itself.

DESCRIPTION OF THE PREFERRED EMBODIMENTS

Figure 1:
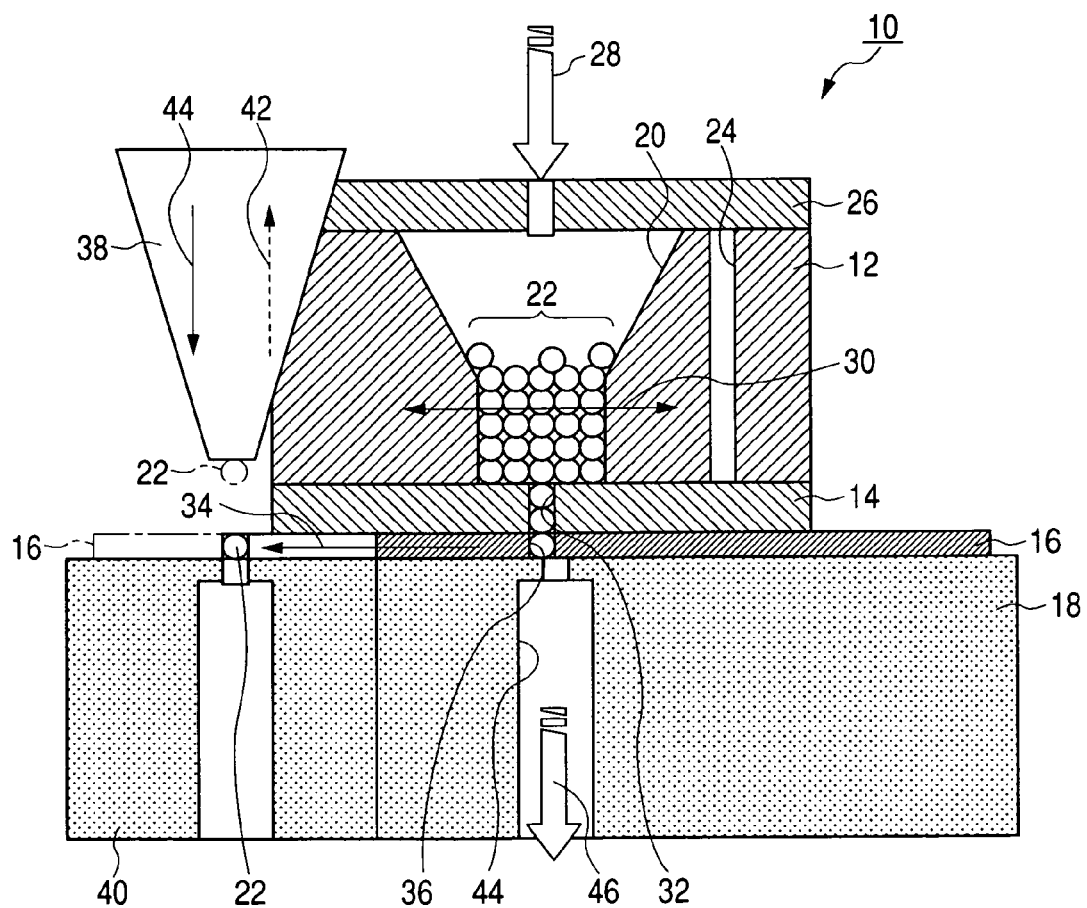
FIG. 1 is a cross sectional explanatory diagram that shows the structure of a solder ball supply device according to an embodiment of the present invention.

Preferred embodiments of a solder ball supplying method and a solder ball supplying device according to the present invention are explained in detail below with reference to the drawings. FIG. 1 is a cross sectional explanatory diagram that shows the structure of a solder ball supply device according to this embodiment.

Referring to FIG. 1, a solder ball supplying device 10 includes an upper block 12, an intermediate block 14, a ball separator 16, and a lower block 18 that are disposed in the stated order from an upper side in a vertical direction.

A hopper 20 having an opening in an upper surface is provided to the upper block 12, and it is possible to introduce a large number of solder balls 22 into the hopper 20. Further, a cleaning path 24 that passes through the upper block 12 in a vertical direction is provided in the vicinity of the hopper 20. It should be noted that, in order to discharge jammed solder balls to an outer portion of the solder ball supplying device, the cleaning path 24 is set larger than at least a receiving hole formed in the ball separator 16 and described later (the cleaning path 24 and the receiving hole are set to the same size in this embodiment).

A top plate 26 that blocks the opening of the hopper 20 is provided in the upper block 12 and above the hopper 20. It is also possible to connect a gas supplying means (not shown) to the top plate 26 by using a gas feed pipe (also not shown), and supply nitrogen gas as an inert gas to prevent oxidation of the solder balls 22 into the inner portion of the hopper 20 (refer to an arrow 28 in FIG. 1).

Agitation of the large number of solder balls 22 that are introduced into the hopper 20 is performed by further providing a swinging means (not shown) to the upper block 12, and operating the swinging means in a direction of an arrow 30 in FIG. 1.

The intermediate block 14 that is provided below the upper block 12 can move relative to the upper block 12 and to the swinging direction (the arrow 30) of the upper block 12. The thickness of the intermediate block 14 is set to be an integer multiple of the diameter of the solder balls 22. A solder ball introduction path 32 that has an inner diameter such that the solder balls 22 can pass through the solder ball introduction path 32 while being arranged in a single line is further provided to the intermediate block 12. The solder balls are thus housed in the intermediate block 16 in a state where the solder balls are arranged in a single line (without protruding out from front and rear surfaces), along the solder ball introduction path 32, when an opening of the solder ball introduction path 32 is positioned at a bottom portion of the hopper 20.

The ball separator 16 that is sandwiched between the intermediate block 14 and the lower block 18 is made from a plate member having a thickness large enough to house a single solder ball 22. The ball separator 16 can slide between the intermediate block 14 and the lower block 18 in the direction of an arrow 34 in FIG. 1. It should be noted that a receiving hole 36 is formed in the ball separator 16. The receiving hole 36 is sized such that it can take in only a single solder ball 22. The solder ball 22 can be taken in from the hopper 20 via the solder ball introduction path 32. It should also be noted that the solder ball 22 that has been taken into the receiving hole 36 is exposed from an end surface of the upper block 12 upon moving to a leftmost edge in the figure by the sliding motion of the ball separator 16. The solder ball 22 can be taken out from the receiving hole 36 by upward and downward motion (in the direction of an arrow 42 in FIG. 1) of a handling means 38 that is provided in a side portion of the upper block 12. Further, a guide block 40 that connects with the lower block 18 is provided directly below the handling means 38. The guide block 40 guides the sliding motion of the ball separator 16.

The lower block 18 that supports the members constituting the solder ball supplying device 10 as described above slidably guides the ball separator 16 together with the guide block 40. A solder ball suction path 44 having an opening in an upper surface is formed in the lower block 18. The solder balls in the hopper are forcibly taken into the receiving hole 36 by a suction action (indicated by an arrow 46 in FIG. 1) by using the solder ball suction path 44.

A positional relationship for the upper opening of the solder ball suction path 44 is set based on a concept described below.

Figure 2:
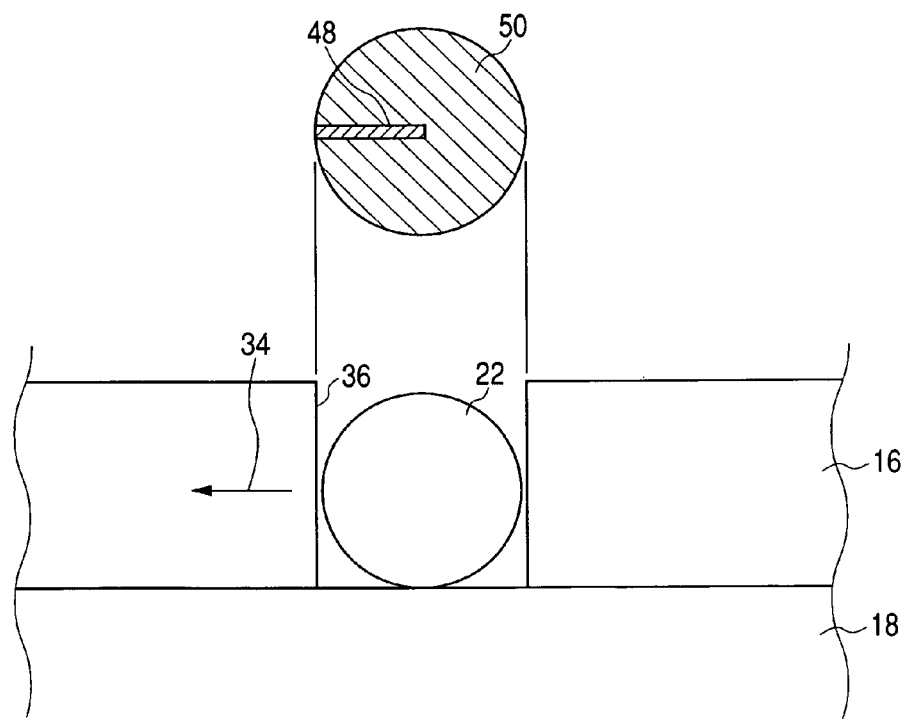
FIG. 2 is a top view of a lower block for explaining the concept of setting the location of an upper opening of a solder ball suction path.

FIG. 2 is a main portion cross sectional diagram for explaining the concept of setting the position of the upper opening of the solder ball suction path.

Referring to FIG. 2, in setting the position of the upper opening of the solder ball suction path, the ball separator 16 is moved to a position at which the solder ball 22 is introduced into the receiving hole 36. Thus, an inner region of the receiving hole 36 at the position where the solder ball 22 is taken in is first determined. After determining the inner region of the receiving hole 36, a rolling trajectory 48 of the solder ball 22 along which the ball separator 16 is moved to the handling means 38 side is made to overlap the inner region. A region 50 that surrounds the rolling trajectory 48 in the inner region can thus be derived by overlapping the inner region with the rolling trajectory. A superior suctioning action on the solder ball 22 can be obtained provided that the position of the upper opening of the solder ball suction path 44 is set to be within the region 50. Further, the position of the upper opening of the solder ball suction path 44 does not overlap with the rolling trajectory 48, and therefore the solder ball 22 that has been taken into the receiving hole 36 can roll at a constant height on an upper surface of the lower block 18. The solder ball 22 can easily be moved to the handling means 38 side.

It should be noted that the region 50 in FIG. 2 shows a range within which it is possible to set the position of the upper opening of the solder ball suction path 44. However, it is not necessary to set the upper opening of the solder ball suction path so as to cover the entirety of the region 50. The position of the upper opening of the solder ball suction path 44 can of course be flexibly set according to a variety of requirements regarding the machining method and design.

Figure 3:
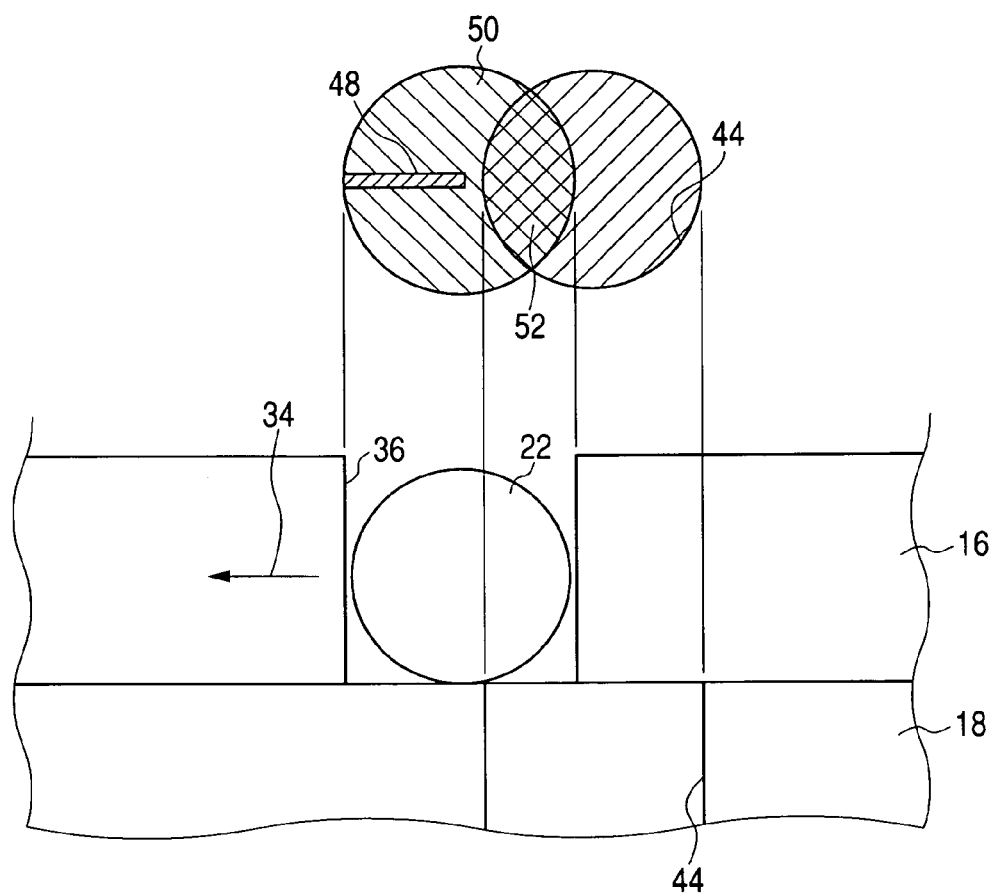
FIG. 3 is a main portion cross sectional explanatory diagram that shows the location of the upper opening of the suction path according to the embodiment of the present invention.

FIG. 3 is a main portion cross sectional explanatory diagram that shows the location of the upper opening of the suction path according to this embodiment. Referring to FIG. 3 (and to FIG. 1), the upper opening of the solder ball suction path 44 may be given a round shape, and may be made to overlap the region 50 such that it does not interfere with the rolling trajectory 48 of the solder ball 22 projected onto the lower block 18. A cross hatched portion 52 shown in FIG. 3, where the round upper opening and the region 50 overlap, is a portion where actual suctioning action is performed. However, the upper opening is located in an inner portion of the region 50, and therefore suctioning of the solder ball 22 can be reliably performed even with this opening shape. It should be noted that it becomes possible to perform machining by using a general purpose cutting tool such as a drill if the upper opening is given a round shape. The time required to machine the lower block 18, and the manufacturing costs can thus be reduced.

A procedure for supplying the solder balls 22 used in connecting a bonding pad that is formed on a magnetic head slider and a pad that is formed on a lead frame side by using the solder ball supplying device 10 configured as described above is explained.

It should be noted that the solder balls 22 that are used in connecting the pad formed on the magnetic head slider and the pad formed on the lead frame side are minute, having an outer diameter on the order of 80 to 150 microns.

Figure 4:
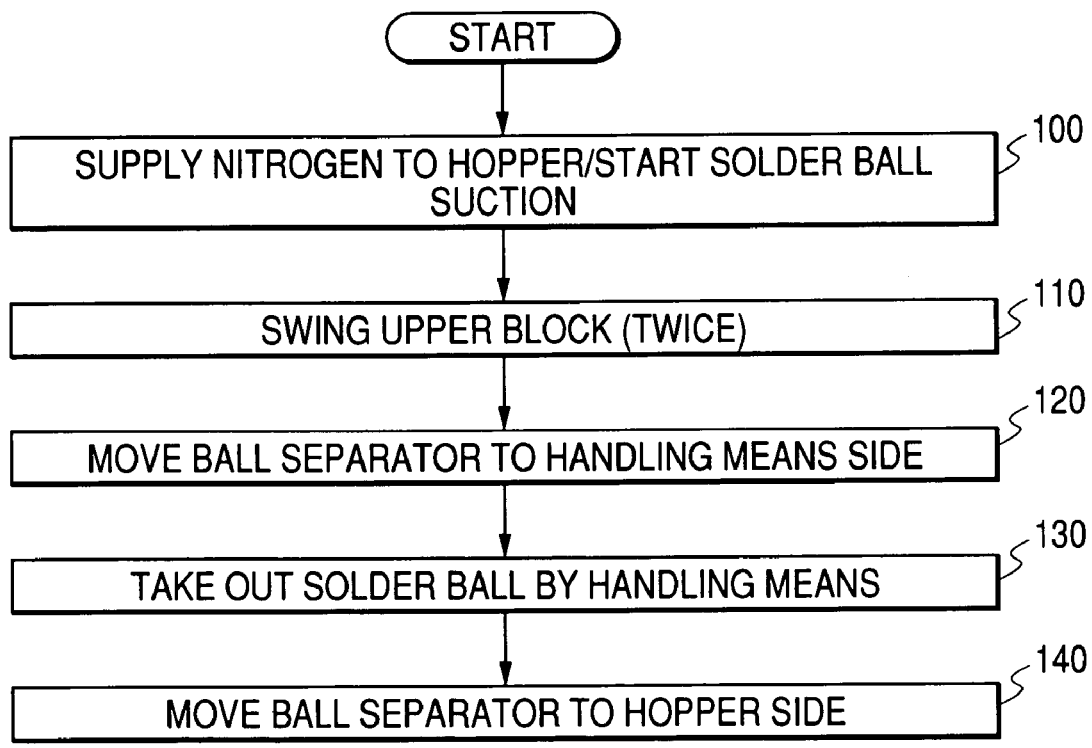
FIG. 4 is a flowchart that shows a procedure for operating a solder ball supplying device.

FIG. 4 is a flowchart that shows a procedure for operating the solder ball supplying device.

After supplying a plurality of the solder balls 22 to the hopper 20, the gas supplying means is operated and nitrogen gas is supplied to the hopper 20 as shown in FIG. 4 in order to supply the solder balls 22 by using the solder ball supplying device 10. Further, suctioning of the solder balls 22 from the solder ball suction path 44 is started together with the nitrogen gas supply (step 100).

After performing the operations of step 100, the upper block is moved reciprocatively two times in the arrow 30 direction by using the swinging means, eliminating any bias in the solder balls 22 within the hopper 20 and moving the solder balls 22 to the bottom of the hopper 20 (step 110).

The solder balls 22 can be reliably sent from the hopper 20 side to the receiving hole 36 of the ball separator 16 by performing the operations of step 100 and step 110, even if the solder balls 22 are small and lightweight, and further, even if the solder balls 22 are difficult to separate due to static electricity.

After introducing the solder ball 22 to the ball separator 16 side, the ball separator 16 is moved in the direction of the arrow 34 to the location of the handling means 38 (step 120). It should be noted that, when moving the ball separator 16 from below the hopper 20 to the handling means 38 side, the solder ball 22 that has been taken into the receiving hole 36 rolls on the lower block 18, along the rolling trajectory 48. Accordingly, defects such as one in which the solder ball 22 approaches the vicinity of the edge of the opening of the solder ball suction path 44, and the solder ball 22 gets caught, can be avoided.

After the ball separator 16 is moved to the handling means 38 side, the handling means 38 is lowered to the receiving hole 36 side, and the solder ball 22 is taken out by using means such as vacuum suction (step 130).

It thus becomes possible to remove one of the solder balls 22 from within the plurality of solder balls 22 if the procedure described above is performed. After the solder ball 22 is taken out by the handling means 38, the handling means 38 is raised, and the ball separator 16 is again moved to the hopper 20 side (step 140). The operations described above may then be repeated.

The solder ball supplying means 10 according to this embodiment does not only supply the solder balls 22. A cleaning function is also provided. The cleaning function is capable of removing a jammed solder ball 22 without disassembling the solder ball supplying device itself for cases where a jam occurs while the solder ball 22 is being sent out.

Figure 5:
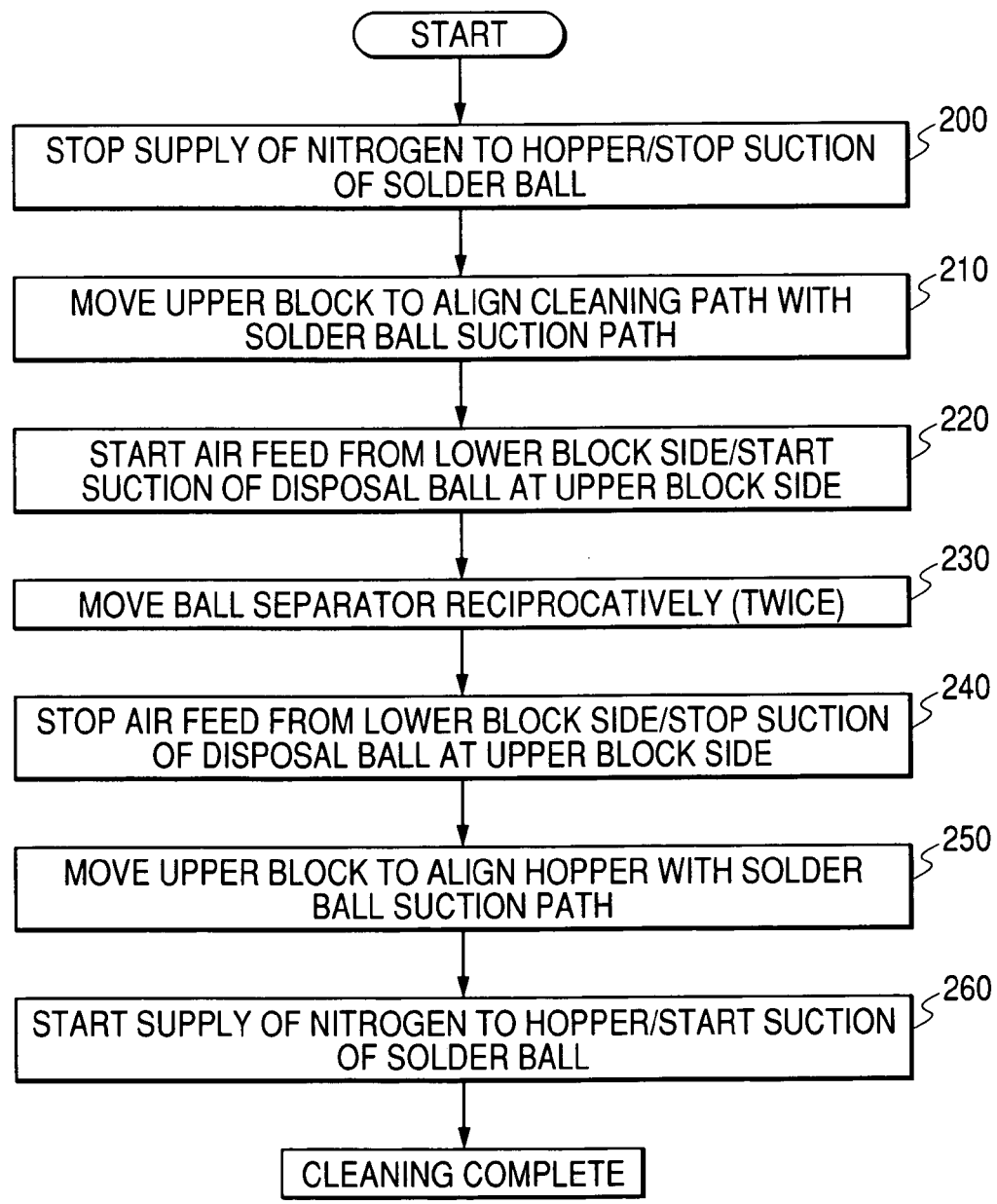
FIG. 5 is a flowchart that shows a cleaning procedure of a solder ball supplying device.

FIG. 5 is a flowchart that shows a procedure for cleaning the solder ball supplying device.

Referring to FIG. 5, when a jam occurs in the solder ball supplying device 10 due to the solder ball 22, first the gas supplying means in the solder ball supplying device 10 is stopped, and nitrogen gas is no longer supplied to the hopper 20. Further, suctioning of the solder ball 22 by the solder ball suction path 44 is also stopped at the same time as the nitrogen gas supply to the hopper 20 is stopped (step 200).

Figure 6:
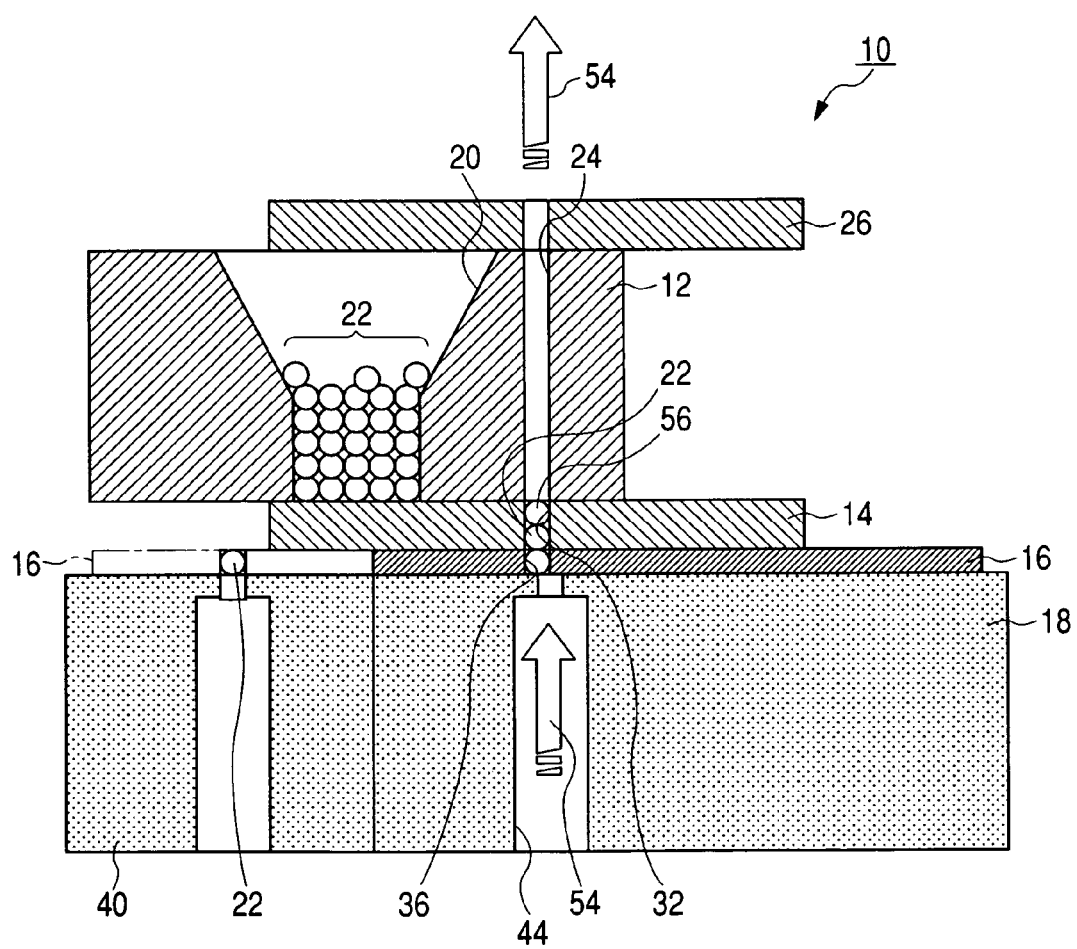
FIG. 6 is a cross sectional explanatory diagram of a supplying device that performs cleaning operations by aligning a cleaning path with a solder ball suction path.
Figure 7:
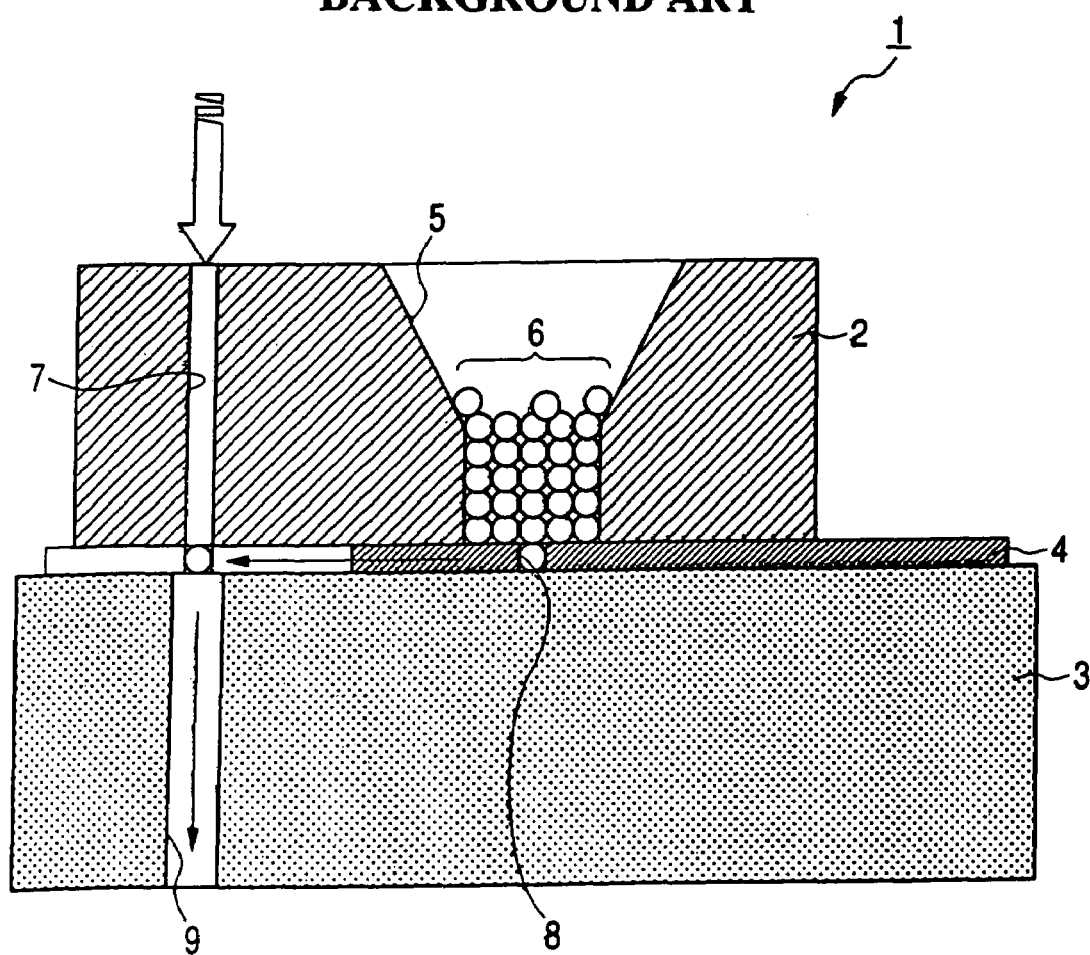
FIG. 7 is a structural explanatory diagram that shows a conventional solder ball supplying device.

After performing the operations of step 200, the upper block 12 is moved to the handling means 38 side, and the cleaning path 24 formed in the upper block 12 is made to align with the solder ball suction path 44 instead of the hopper 20 (step 210). FIG. 6 is a cross sectional explanatory diagram of the solder ball supplying device performing cleaning operations by making the cleaning path align with the solder ball suction path.

Referring to FIG. 6, after movement of the upper block 12 makes the cleaning path 24 align with the solder ball suction path 44, air is fed to the solder ball suction path 44 from the lower block 18 side, and suctioning for removing the jammed solder ball 22 is performed from an air feeding pipe (not shown) that is connected to the top plate 26 (step 220). An arrow 54 in FIG. 6 shows the direction of a cleaning air flow during cleaning.

After the cleaning air flow is fed in the direction of the arrow 54, the ball separator 16 is moved reciprocatively two times from this state (step 230).

There is a danger that the solder ball may deform within the solder ball introduction path 32, causing a jam as shown in FIG. 6, with the solder ball supplying device 10. If a solder ball 56 that has deformed exists within the solder ball introduction path 32, the solder ball 22 that is positioned directly below the solder ball 56 is pushed out due to the deformation of the solder ball 56, protruding out from a lower opening of the intermediate block 16. In this case, moving the ball separator 16 reciprocatively can make an edge portion of the receiving hole 36 push up the solder ball 22 directly below the solder ball 56, and the solder ball 56 can be removed from within the solder ball introduction path 32. The cleaning air flow is fed into the solder ball introduction path 32 in the direction of the arrow 54 here as described above. Accordingly, the solder ball 56 that has been removed from within the solder ball introduction path 32 by the reciprocative motion of the ball separator 16 (and the solder ball 22 that is positioned below the solder ball 56 as well), moves further upward, and is then expelled to a portion outside of the solder ball supplying device 10.

After removing the solder ball 56 that is jammed within the solder ball supplying device 10 to a portion outside of the solder ball supplying device 10 by the sequence of operations described above, the air feed to the solder ball suction path 44 and the suctioning action from the air feed pipe are stopped in order to stop the cleaning air flow shown by the arrow 54 (step 240).

In addition, after performing step 240, the upper block 12 is moved until the solder ball introduction path 32 or the like is directly below the hopper 20 (step 250). After moving the upper block 12 from the state of FIG. 6 to the state of FIG. 1 by the operations of step 250, the gas supplying means may again be operated, supplying nitrogen gas to the hopper 20 and starting the suctioning of the solder balls 22 by the solder ball suction path 44 (step 260). Operations for supplying the solder balls 22 may thus be restarted.

For cases where a jam occurs due to the solder ball 22 while operations for supplying the solder. ball 22 are being performed, the solder ball supplying device 10 may be placed in a cleaning state, and the solder ball that is causing the jam may be removed. After cleaning is complete by removing the solder ball, processing may again return to operations for supplying the solder balls 22. It is not necessary to disassemble the solder ball supplying device 10 in order to remove the solder ball that is causing the jam. It thus becomes possible to increase the operating efficiency of the solder ball supplying device 10.

It should be noted that, although solder balls used for the slider pad in the magnetic head are taken as an example in this embodiment, there are no limitations placed on the use of the solder ball supplying device. In addition, the solder ball supplying device can of course also be applied to solder balls having different outer diameters.

This application claims priority from Japanese Patent Application No. 2003-311010 filed Sep. 3, 2003, which is hereby incorporated by reference herein.

What is claimed is:

1. A solder ball supplying method, comprising:
   introducing a solder ball from a hopper formed in an upper block to a receiving hole of a ball separator that is sandwiched between the upper block and a lower block;
   sliding the ball separator between the upper block and the lower block; and
   sending the solder ball that has been taken into the receiving hole to an outside of the upper block and the lower block, wherein
   when introducing the solder ball from the hopper into the receiving hole, the solder ball is forcibly introduced into the receiving hole by sucking the solder ball from a solder ball suction path within a projected region on the lower block, the projected region being situated in an inner region of the receiving hole, and
   an upper opening of the solder ball suction path is configured to not overlap a rolling trajectory of the solder ball at a time when the solder ball is taken into the receiving hole.

2. A solder ball supplying method according to claim 1, further comprising:
   increasing a pressure within the hopper when introducing the solder ball from the hopper into the receiving hole.

3. A solder ball supplying method according to claim 1, further comprising:
   swinging the upper block in a direction in which the ball separator slides when introducing the solder ball from the hopper into the receiving hole.

4. A solder ball supplying method according to claim 1, further comprising:
   inserting an intermediate block between the upper block and the ball separator, wherein the intermediate block has a plate thickness of a multiple of a diameter of the solder ball and includes a solder ball introduction path of a size corresponding to an inner diameter of the receiving hole; and
   performing alignment on the solder ball in the solder ball introduction path before the solder ball is introduced into the receiving hole.

5. A solder ball supplying method according to claim 1, further comprising:
   removing a solder ball that becomes jammed while being conveyed from the hopper to the receiving hole by moving the upper block in a direction in which the ball separator slides, and feeding air into a path extending from the upper block to the lower block through a cleaning path that is formed in the upper block.

6. A solder ball supplying device, comprising:
   an upper block including a hopper configured to introduce a solder ball;
   a lower block;
   a ball separator, sandwiched between the upper block and the lower block, including a receiving hole configured to receive the solder ball from a bottom portion of the hopper, and to send the solder ball to an outside of the upper block and the lower block by sliding the ball separator; and
   a solder ball suction path provided within a projected region on the lower block, and configured to allow a solder ball to be forcibly introduced from the hopper into the receiving hole via suction,
   wherein an upper opening of the solder ball suction path is configured to not overlap a rolling trajectory of the solder ball that has been taken into the receiving hole.

7. A solder ball supplying device according to claim 6, further comprising:
   a gas supplying means connected to the upper block configured to increase a pressure within the hopper.

8. A solder ball supplying device according to claim 6, further comprising:
   swinging means disposed to the upper block, configured to enable the upper block to move reciprocatively in a direction in which the ball separator slides.

9. A solder ball supplying device according to claim 6, further comprising:
   an intermediate block provided between the upper block and the ball separator, the intermediate block includes a plate thickness that is a multiple of a diameter of the solder ball and includes a solder ball introduction path of a size that corresponds to an inner diameter of the receiving hole.

10. A solder ball supplying device according to claim 6, further comprising:
    a cleaning path provided in the upper block by a side of the hopper, wherein a solder ball that is jammed within a path extending from the upper block to the lower block through the cleaning path is removed by feeding air into the path.

* * * * *